United States Patent
Miyazaki

(10) Patent No.: US 7,651,912 B2
(45) Date of Patent: Jan. 26, 2010

(54) SEMICONDUCTOR DEVICE AND METHOD OF FABRICATING THE SAME

(75) Inventor: Shoichi Miyazaki, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 109 days.

(21) Appl. No.: 11/871,591

(22) Filed: Oct. 12, 2007

(65) Prior Publication Data

US 2008/0315283 A1    Dec. 25, 2008

(30) Foreign Application Priority Data

Oct. 13, 2006    (JP)    .............................. 2006-280184

(51) Int. Cl.
  *H01L 21/336*    (2006.01)

(52) U.S. Cl. ........................ 438/257; 438/203; 438/593; 438/201; 438/211; 257/E29.3; 257/315; 257/314; 257/316

(58) Field of Classification Search ................. 257/316, 257/E21.546, E27.103, E29.3, E29.129, 314, 257/315; 438/257, 211, 593, 424, 435, 314, 438/315, 316, FOR. 203, 201

See application file for complete search history.

(56) References Cited

U.S. PATENT DOCUMENTS

| 6,661,052 | B2 | 12/2003 | Matsui et al. |
| 6,784,503 | B2 | 8/2004 | Shimizu et al. |
| 7,400,010 | B2 * | 7/2008 | Matsuno ..................... 257/316 |
| 2006/0289926 | A1 | 12/2006 | Matsuno |
| 2007/0047304 | A1 * | 3/2007 | Lee et al. ............... 365/185.05 |

FOREIGN PATENT DOCUMENTS

| JP | 2002-110822 | 4/2002 |
| JP | 2005-85996 | 3/2005 |

* cited by examiner

*Primary Examiner*—Thao X Le
*Assistant Examiner*—Thanh Y Tran
(74) *Attorney, Agent, or Firm*—Oblon, Spivak, McClelland, Maier & Neustadt, L.L.P.

(57) ABSTRACT

A semiconductor device includes a semiconductor substrate having a plurality of element regions and a plurality of element isolation regions in a first direction, a plurality of floating gate electrodes formed via a gate insulating film on the respective element regions, an intergate insulating film formed on the floating gate electrodes, a plurality of control gate electrodes formed on the intergate insulating film so as to extend over the adjacent floating gate electrodes, and an element isolation insulating film formed in the element isolation region and having an upper end located higher than the upper surface of the gate insulating film, the element isolation insulating film including a part formed between the control gate electrodes so that the central sidewall of the element isolation insulating film is located lower than the end of the sidewall of the element isolation insulating film.

4 Claims, 16 Drawing Sheets

SEMICONDUCTOR DEVICE AND METHOD OF FABRICATING THE SAME

CROSS-REFERENCE TO RELATED APPLICATIONS

This application is based on and claims the benefit of priority from the prior Japanese Patent Application No. 2006-280184, filed on Oct. 13, 2006, the entire contents of which are incorporated herein by reference.

BACKGROUND OF THE INVENTION

1. Field of the Invention

The present invention relates to a semiconductor device having floating gate electrodes isolated from one another by element isolation films and a method of fabricating the same.

2. Description of the Related Art

Fabrication of semiconductor devices such as flash memories has recently employed a process in which a gate electrode layer or floating gate electrode layer is formed prior to the forming of element isolation regions of the shallow trench isolation (STI) structure. For example, JP-A-2002-110822 discloses one of such processes in which a gate insulating film is formed on an upper surface of the semiconductor substrate. A gate electrode layer or floating gate electrode layer is formed on the gate insulating film. Subsequently, a trench is formed in the surface of the substrate in a predetermined direction, whereby a gate insulating film and gate electrode layer of each transistor are formed. According to the process disclosed in the above-referenced publication, a tunnel insulating film is formed on the silicon substrate by a thermal oxidation method, and a polycrystalline silicon layer doped with impurities is formed as a floating gate electrode layer. Furthermore, a silicon nitride film is formed to serve as a stopper film in a planarizing process by the chemical mechanical polishing (CMP). Additionally, a silicon oxide film is formed by the low pressure chemical vapor deposition (LPCVD) method to serve as a mask material in an etching process by the reactive ion etching (RIE) method. Thereafter, the silicon oxide film, silicon nitride film, polycrystalline silicon layer and tunnel insulating film are sequentially etched by the RIE method and the silicon substrate is further etched, so that the trench is formed.

Subsequently, a silicon oxide film is deposited in the trench by the plasma CVD method after several steps, whereupon the element isolation trench is completely buried. The silicon oxide film is planarized on the upper surface of the silicon nitride film by the CMP method. Thereafter, the silicon nitride film to be formed into the stopper film is removed. As a result, a floating gate electrode, gate insulating film and element isolation insulating film are processed and formed.

When the fabricating method disclosed in JP-A-2002-110822 is applied, each film with a predetermined film thickness is deposited on the upper surface of the substrate, and a trench is formed in the upper surface of the substrate in a predetermined direction. The element isolation insulating film is buried in the trench. The polycrystalline silicon layer doped with high electrically conductive impurities is removed in a direction intersecting a predetermined direction. The polycrystalline silicon layers adjacent to each other are separated from each other, so that a floating gate electrode is two-dimensionally formed on the upper surface of the substrate. Thus, the floating gate electrode can be formed on the upper surface of the substrate with high area efficiency.

When the above-described method is applied to fabrication of semiconductor devices, the floating gate electrode is two-dimensionally arranged on the upper surface of the substrate in the predetermined direction and the direction intersecting the predetermined direction by dividing the polycrystalline silicon layer on the upper surface of the substrate. However, the upper surface of the element isolation film needs to be located higher than a forming face of the upper surface of the gate insulating film. Accordingly, even when treated to be removed, the polycrystalline silicon layer formed between the element isolation insulating films adjacent to each other remains in the forming direction of the trench along the sidewall of the element isolation insulating film. As a result, the floating gate electrodes adjacent to each other in the predetermined direction are rendered electrically conductive, resulting in failure. In particular, the width of a floating gate electrode layer formed between the element isolation insulating films has been reduced with recent reduction in the circuit design rules. Consequently, an aspect ratio has been increased such that the conditions for dividing the floating gate electrode layer have been more and more severe.

BRIEF SUMMARY OF THE INVENTION

Therefore, an object of the present invention is to provide a semiconductor device in which the floating gate electrodes adjacent to each other can be prevented from electrical conduction and a method of fabricating the semiconductor device.

In one aspect, the present invention provides a method of fabricating a semiconductor device, comprising forming a gate insulating film on a first upper surface of a semiconductor substrate, the gate insulating film having a second upper surface forming a floating gate electrode layer on the gate insulating film, the floating gate electrode layer having a third upper surface, forming a trench in the floating gate electrode layer, the gate insulating film and the substrate in a predetermined direction, thereby dividing each of the floating gate electrode layer and the gate insulating film into a plurality of first divided regions, forming an element isolation insulating film in the first divided regions so that the element isolation insulating film including a silicon oxide film has a fourth upper surface located lower than the third upper surface of the floating gate electrode layer and higher than the second upper surface of the gate insulating film, forming an intergate insulating film so that the floating gate electrode layer and the element isolation insulating film are covered with the intergate insulating film, the intergate insulating film having a silicon oxide film layer, forming a control gate electrode layer on the intergate insulating film, removing the control gate electrode layer in an intersecting direction intersecting the predetermined direction, thereby dividing the control gate electrode layer into a plurality of second divided regions, etching the intergate insulating film and the element isolation insulating film in the second divided regions when a selectivity between the floating gate electrode layer and the intergate insulating film is in a range of 1:1.5 to 1:2, and removing the floating gate electrode layer located in the second divided regions.

The invention also provides a method of fabricating a semiconductor device, comprising forming a gate insulating film on a first upper surface of a semiconductor substrate, the gate insulating film having a second upper surface, forming a floating gate electrode layer having a film thickness of about 90 nm on the second upper surface of the gate insulating film and a third upper surface, forming a trench in the floating gate electrode layer, the gate insulating film and the semiconductor substrate in a predetermined first direction, thereby dividing each of the floating gate electrode layer and the gate insulating film into a plurality of first regions, forming an element isolation insulating film in the trench so that the element isolation insulating film has a fourth upper surface located lower than the third upper surface of the floating gate electrode layer with a step of not more than 70 nm with respect to the third upper surface of the floating gate electrode layer and further located higher than the second upper surface of gate insulating film, the element isolation insulating film having a sidewall, forming an intergate insulating film so that the floating gate electrode layer and the element isolation insulating film are covered with the intergate insulating film, forming a control gate electrode layer on the intergate insulating film, removing the control gate electrode layer in a second direction intersecting the first direction, thereby dividing the control gate electrode layer into a plurality of divided regions, removing the intergate insulating film and the element isolation insulating film in the divided regions of the control gate electrode layer, thereby removing the element isolation insulating film so that a center of the sidewall of the element isolation insulating film in the predetermined direction is located lower than an end of the sidewall of the element isolation insulating film, and removing the floating gate electrode layer located in the divided regions of the control gate electrode layer and the intergate insulating film.

In another aspect, the invention provides a semiconductor device comprising a semiconductor substrate having a plurality of element regions and a plurality of element isolation regions in a first direction, a plurality of floating gate electrodes formed via a gate insulating film on the respective element regions in the first direction at a first interval, an intergate insulating film formed on the floating gate electrodes, a plurality of control gate electrodes formed on the intergate insulating film in the first direction at a first interval so as to extend over the floating gate electrodes adjacent to each other in a second direction intersecting the first direction, and an element isolation insulating film formed in the element isolation region and having an upper end located higher than the upper surface of the gate insulating film, the element isolation insulating film including a part formed between the control gate electrodes so that the central sidewall of the element isolation insulating film in the predetermined direction is located lower than the end of the sidewall of the element isolation insulating film.

BRIEF DESCRIPTION OF THE DRAWINGS

Other objects, features and advantages of the present invention will become clear upon reviewing the following description of one embodiment with reference to the accompanying drawings, in which.

DETAILED DESCRIPTION OF THE INVENTION

One embodiment of the present invention will be described with reference to the accompanying drawings. The invention is applied to the structure of a memory cell region of a NAND flash memory in the embodiment. Identical or similar parts are labeled by the same reference symbols throughout the figures. It is noted that the figures illustrate frame formats of the device and the relationship between a thickness and planar dimension, thickness ratio of each layer and the like differ from those of actually fabricated devices.

Figure 1:
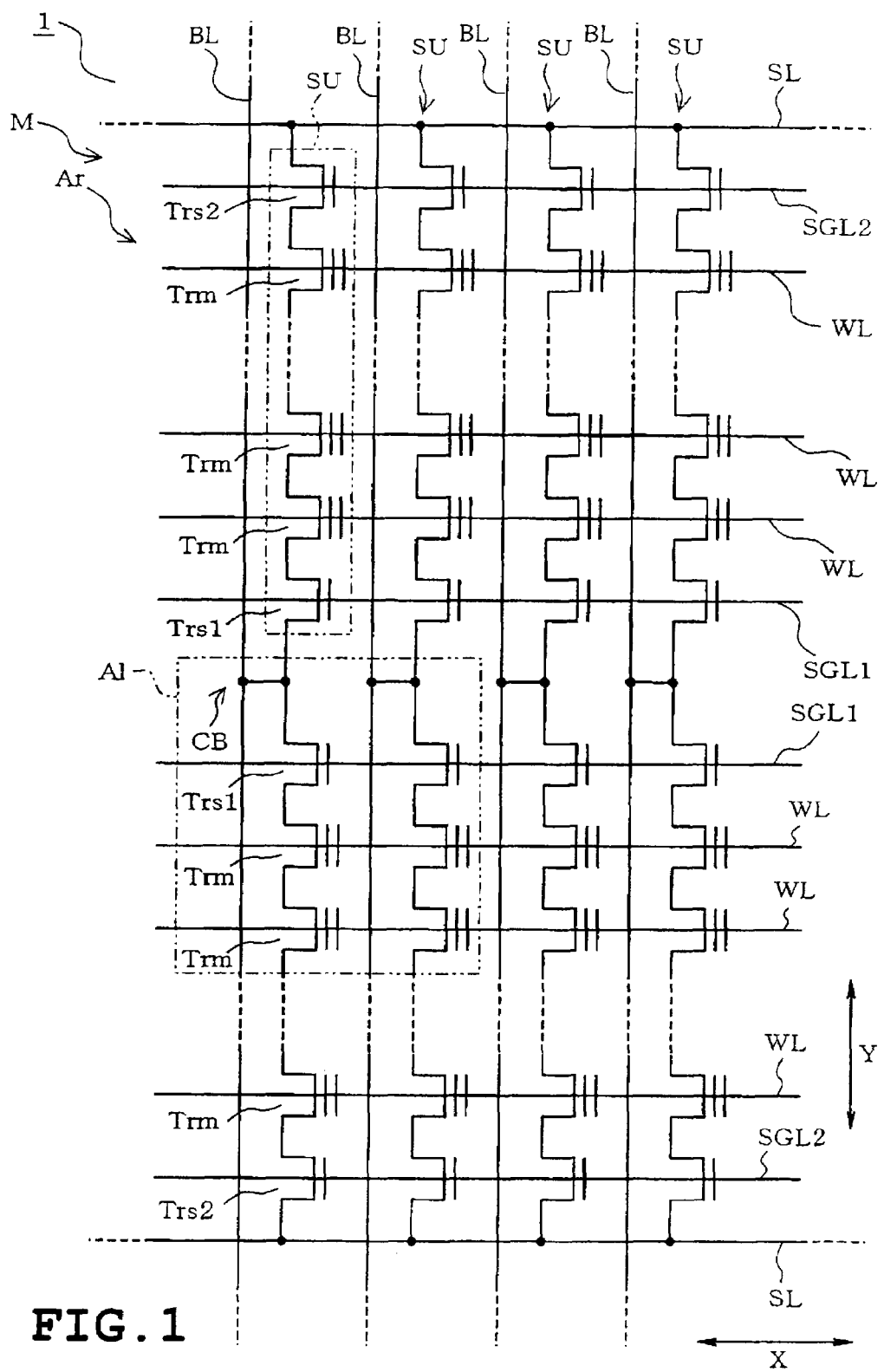
FIG. 1 is an equivalent circuit diagram showing a part of memory cell array of a NAND flash memory in accordance with one embodiment of the present invention.

FIG. 1 is a circuit schematic equivalent to a part of memory cell array composed in a memory cell region of the NAND flash memory. As shown in FIG. 1, the NAND flash memory 1 serving as a semiconductor device includes a memory cell region M. A memory cell array Ar is configured in the memory cell region M. Each NAND cell unit comprises two selective gate transistors Trs1 and Trs2 and a plurality of memory cell transistors Trm ($2^n$ where n is a positive number, for example, 8) series connected between the selective gate transistors Trs1 and Trs2. In each NAND cell unit SU, memory cell transistors Trm adjacent to each other have a common source/drain region.

The memory cell transistors Trm arranged in the X direction (corresponding to a word line direction and gate width (length) direction) are connected in common to a word line WL (control gate line). Furthermore, the selective gate transistors Trs1 arranged in the X direction in FIG. 1 are connected in common to a selective gate line SGL1. The selective gate transistors Trs2 are connected in common to a selective gate line SGL2. A bit line contact CB is connected to a drain region of the selective gate transistor Trs1. The bit line contact CB is connected to a bit line BL extending in the Y direction (corresponding to the direction of gate length (width) and bit line direction) perpendicular to the X direction in FIG. 1. The selective gate transistor Trs2 is connected via a source region to a source line SL extending in the X direction in FIG. 1.

Figure 2:
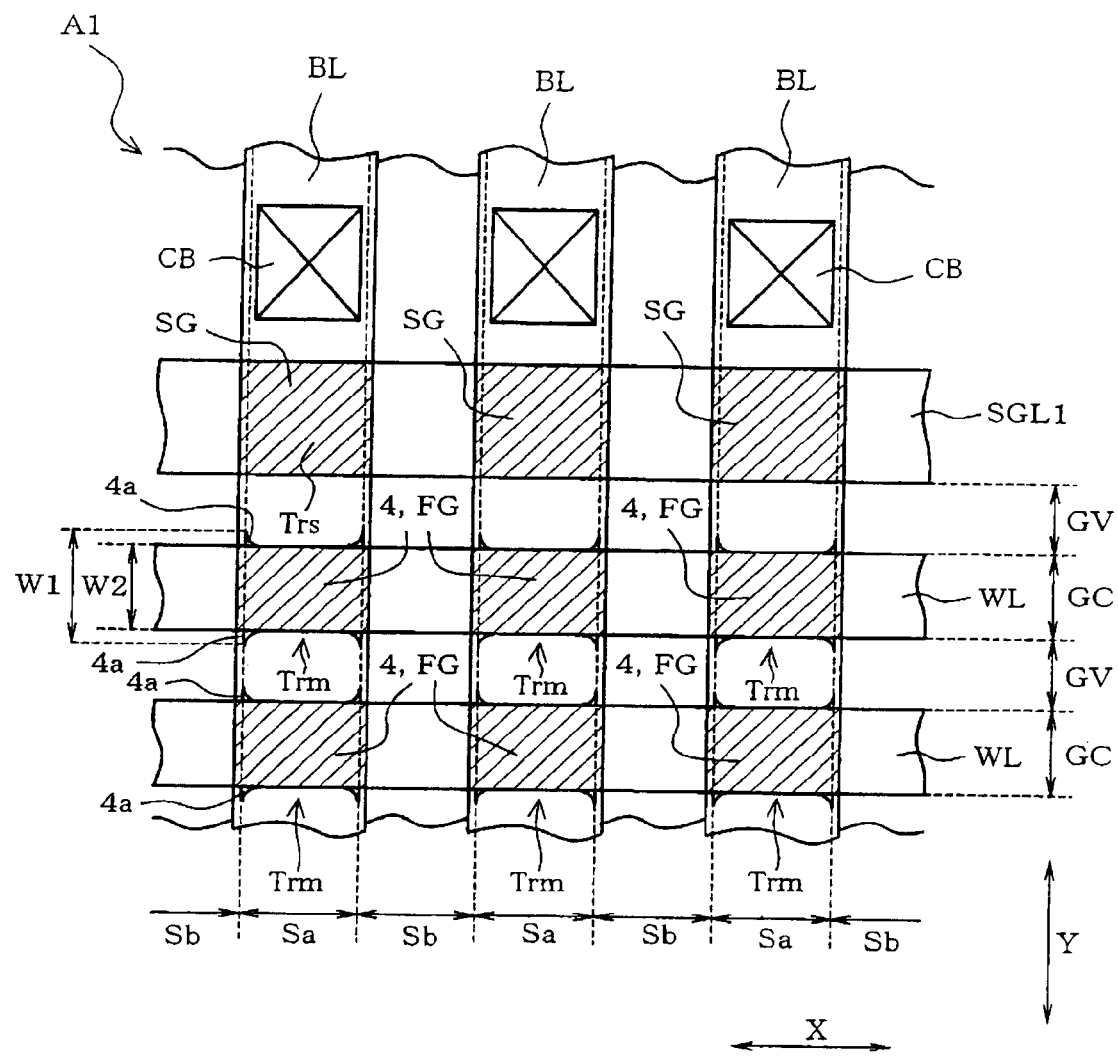
FIG. 2 is a plan view showing a frame format of the memory cell.

FIG. 2 is a plan view showing a layout pattern of part (region A1 in FIG. 1) of the memory cell region A plurality of element isolation regions Sb each of which has a shallow trench isolation (STI) structure are formed in a p-type silicon substrate 2 so as to extend in the Y direction in FIG. 2. The element isolation regions Sb are formed in the X direction at predetermined intervals. As a result, a plurality of element regions (active regions) Sa are formed so as to be separated from each other in the X direction in FIG. 2.

Word lines WL of the memory cell transistors Trm are formed in the X direction perpendicular to the element regions Sa in FIG. 2. The word lines WL are constituted by connecting control gate electrodes CG of the memory cell transistors Trm and configured in gate electrode forming regions GC in FIG. 2. The word lines WL are formed so as to be spaced away from one another in the Y direction in FIG. 2. More specifically, the word lines WL are electrically separated from one another in the Y direction by interlayer insulating films (not shown) buried in gate electrode separation regions GV.

Furthermore, the selective gate transistor Trs1 at the bit line contact CB side includes a pair of selective gate lines SGL1 formed in the X direction in FIG. 2. The paired selective gate lines SGL1 are formed with the bit line contact CB being interposed therebetween. The bit line contacts CB are formed on the element region (active region) between the paired selective gate lines SGL1.

Floating gate electrodes FG of the memory cell transistors Trm are formed over the respective element regions Sa intersecting with the word lines WL. The floating gate electrodes FG are aligned both in the X and Y directions. The word lines WL are formed over the plural element regions Sa and element isolation regions Sb so as to extend in the X direction in FIG. 2. The word lines WL are further formed over the floating gate electrodes FG aligned in the X direction. Furthermore, selective gate electrodes SG of the selective gate transistors Trs1 are formed in regions where the selective gate lines SG and the element regions Sa intersect with each other. The selective gate electrodes SG are connected to the selective gate lines SGL1 in the X direction.

Figure 3:
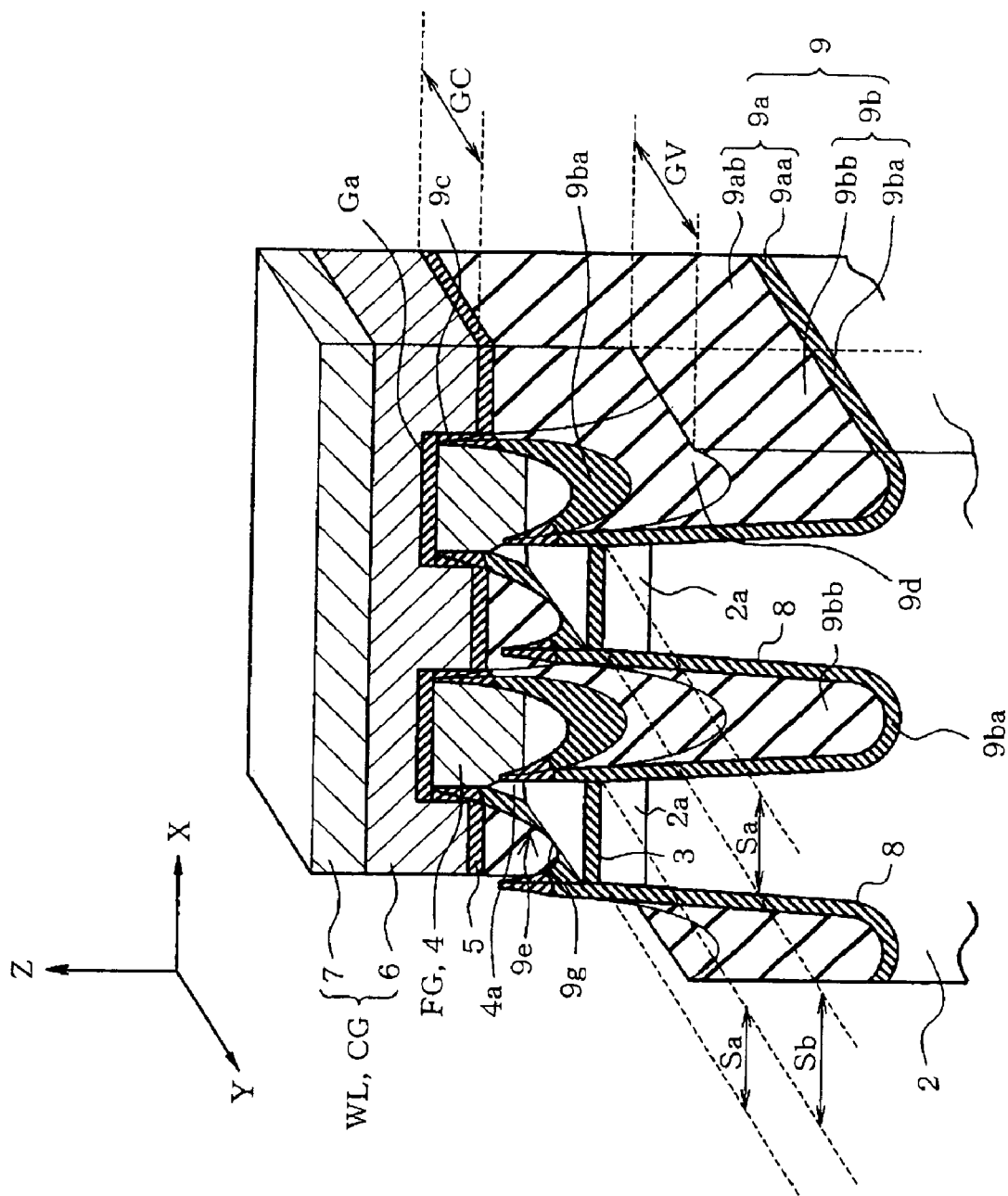
FIG. 3 is a perspective view showing a frame format of the structure of the memory cell.

The structure of the floating gate electrodes FG and the element isolation regions Sb will now be described in detail. The description of a peripheral circuit region will be eliminated since the embodiment has no relation with the peripheral circuit region. FIG. 3 shows a schematic structure in a region of the gate electrode forming region GC and a region of the gate electrode isolation region GV of the planar structure as shown in FIG. 2. An interlayer insulating film is to be formed on the substrate 2 in the gate electrode isolation region GV, the gate insulating film 3 and the element isolation insulating film 9 when the NAND flash memory has been completed. However, the interlayer insulating film is eliminated for the sake of easiness in the description. Furthermore, a barrier film is to be formed on the interlayer insulating film and the metal silicide layer 7. However, the barrier film is also eliminated.

As shown in FIG. 3, a silicon oxide film 3 serving as a gate insulating film (tunnel insulating film) is formed on the element region Sa of the upper surface of the p-type silicon substrate 2. On the silicon oxide film 3 in the gate electrode forming region GC are sequentially stacked a polycrystalline silicon layer 4 doped with impurities such as phosphorus, a stacked structure of a silicon nitride film-silicon oxide film-silicon nitride film-silicon oxide film-silicon nitride film (NONON film 5) serving as an intergate insulating film and interpoly insulating film, a polycrystalline silicon layer 6 doped with impurities such as phosphorus and a metal silicide layer 7, as a control gate electrode layer CG.

The polycrystalline silicon layer 4 is formed on the silicon oxide film 3 in the Y direction or a predetermined direction so as to be divided and lined up in the gate electrode isolation region GV. The plural lined polycrystalline silicon layers are further divided and lined up in the X direction (intersecting direction) in the element isolation region Sb. The NONON film 5 extends over the plural polycrystalline silicon layers 4 lined up in the X direction. In the gate electrode forming region GC, the polycrystalline silicon layer 4 is formed into a floating gate electrode FG serving as an electrically charged layer and having a film thickness of about 85 nm. Although the aforesaid polycrystalline silicon layer 4 has conventionally has a film thickness of about 140 nm, the film thickness can be reduced in the embodiment as compared with the conventional structure. Furthermore, the polycrystalline silicon layer 6 and the metal silicide layer 7 are formed into the control gate electrode CG and word lines WL. The silicon oxide film 3 is formed on the element forming region Sa of the substrate 2 in the gate electrode isolation region GV constituting a region between the gate electrode forming regions GC adjacent to each other. A diffusion layer 2a serving as a source/drain region is formed in the surface layer of the substrate 2 under the silicon oxide film 3 of the gate electrode isolation region GV.

The gate electrode forming region GC includes a region where a structure film of the word lines WL and the floating gate electrodes FG is to be formed. The gate electrode forming region GC further includes a forming region of the element isolation insulating film 9 which to be formed beneath the structure film of the word lines WL and the floating gate electrodes FG. The gate electrode isolation region GV includes a region where the structure film of the word lines WL and the floating gate electrodes FG is isolated on the substrate 2.

A trench 8 with a predetermined depth is formed in the element isolation region Sb in the polycrystalline silicon layer 4, the silicon oxide film 3 and the substrate 2 in the predetermined direction or the Y direction in FIG. 1. The element isolation insulating film 9 is buried in the trench 8. The element isolation insulating film 9 extends over the gate electrode forming region GC and the gate electrode isolation region GV and is formed so as to include an upper portion located higher than the upper surface of the silicon oxide film 3 formed on the silicon substrate 2. The element isolation insulating film 9 includes a first element isolation insulating portion 9a formed in the gate electrode forming region GC and a second element isolation insulating portion 9b formed in the gate electrode isolation region GV. The element isolation insulating film 9 of both first and second portions 9a and 9b is buried in the trench 8 in the same step, and thereafter, the upper surface side of the second element isolation insulating film 9b is removed.

The second element isolation insulating portion 9b is formed so as to electrically separate the element forming regions Sa adjacent in the X direction or active areas from each other. The second element isolation insulating portion 9b is comprised of a silicon oxide film 9ba formed along the inner surface of the trench 8 and a polysilazane film 9bb which is a coating type oxide film or a coating type insulating film formed inside the silicon oxide film 9ba. The second element isolation insulating portion 9b is formed on a boundary between the first element isolation insulating portions 9a of the gate electrode forming region GC in the Z direction or vertically. Each sidewall 9e protrudes upward from the upper surface of the silicon oxide film 3 in the Y direction. Each sidewall 9e includes a central part 9g with an upper surface. The second element isolation insulating portion 9b is formed into such a U-shape that an upper surface of the central part 9g is located lower than an upper portion or upper surface of a sidewall edge 9c which serves as a boundary of the sidewall 9e and the gate electrode forming region GC.

The first element isolation insulating portion 9a of the gate electrode forming region GC is comprised of a silicon oxide film 9aa formed along the inner surface of the trench 8 and a polysilazane film 9ab formed inside the silicon oxide film 9aa in the trench 8. The first and second element isolation insulating portions 9a and 9b are configured continuously in the Y direction. On the first element isolation insulating portion 9a are stacked the NONON film 5, polycrystalline silicon layer 6, metal silicide layer 7 and silicon nitride film 10 sequentially. As shown in FIG. 3, the NONON film 5 is formed so as to cover the polycrystalline silicon layer 4 formed in the gate electrode forming region GC and the first element isolation insulating potion 9a. Furthermore, the NONON film 5 formed in the gate electrode isolation region GV is formed along the sidewall edge 9c which serves as a boundary of the gate electrode isolation region GV and the gate electrode forming region GC. The NONON film 5 is further formed into the shape of a delta cone so as to be in structural contact with the second element isolation insulating portion 9b located below a upper boundary Ga serving as the upper portion of the sidewall edge 9c.

In the gate electrode isolation region GV, the second element isolation insulating portion 9b includes an upper surface having a generally U-shaped cross-section in the X direction as viewed in FIG. 3. The upper surface of the insulating portion 9b includes a central part (inner lower end) 9d located lower than the surface of the silicon substrate 2. The second element isolation insulating portion 9b located in the boundary of the element region Sa and the portion 9b has a sidewall 9e in the Y direction as viewed in FIG. 3. The whole sidewall 9e is formed so as to protrude upward from the surface of the silicon substrate 2. The sidewall 9e is formed so that a cross-section thereof is substantially U-shaped in the Y direction in FIG. 3 such that the central sidewall 9g thereof is located lowest. Furthermore, the second element isolation insulating film 9b is formed so that the central sidewall 9g thereof is located lower than the sidewall 9e and the sidewall edge 9c.

When the second element isolation insulating film 9b is not formed so that the central part 9d thereof is located lower than the sidewall edge 9c thereof, the polycrystalline silicon layer 4 conventionally remains at the side of the sidewall 9e in the Y direction, thereby bonding the adjacent floating gate electrodes FG. In the embodiment, however, the polycrystalline silicon layer 4 is formed so as to have a film thickness of about 85 nm and so as to be lower than in the conventional configuration. Furthermore, the second isolation insulating film 9b is formed substantially into the U-shape so that the central sidewall 9g thereof is lower than the sidewall edge 9c. Accordingly, an amount of the polycrystalline silicon layer 4 remaining at the side of the sidewall 9e is reduced. More specifically, as shown in FIG. 3, only a slight amount of remaining film 4a remains along the polycrystalline silicon layer 4 of the gate electrode forming region GC and the sidewall 9e of the second element isolation insulating portion 9b.

As shown in FIG. 2, reference symbol "W1" designates a width between distal ends of the remaining film 4a at both sides of the polycrystalline silicon layer 4 in the Y direction, and reference symbol "W2" designates a width of the gate electrode forming region GC. It was confirmed that the width W1 was able to be suppressed to (W2+6) nm or below. Accordingly, even when the width of the gate electrode isolation region GV in the Y direction is reduced, a high conductive polycrystalline silicon layer 4 can be prevented from bonding or joining adjacent floating gate electrodes FG, whereupon the adjacent floating gate electrodes FG can be prevented from electrically conductive. Thus, any failure due to the electrical conduction between the adjacent electrodes can be prevented.

The following will describe a method of fabricating the memory cell region of the NAND flash memory. In the following description, the invention is applied to a gate preforming process in which floating gate electrodes FG are formed prior to element isolation regions Sb. One or more steps which will be described later may be eliminated only if the invention can be realized. Furthermore, one or more steps which are general may be added to the following method.

Figure 4:
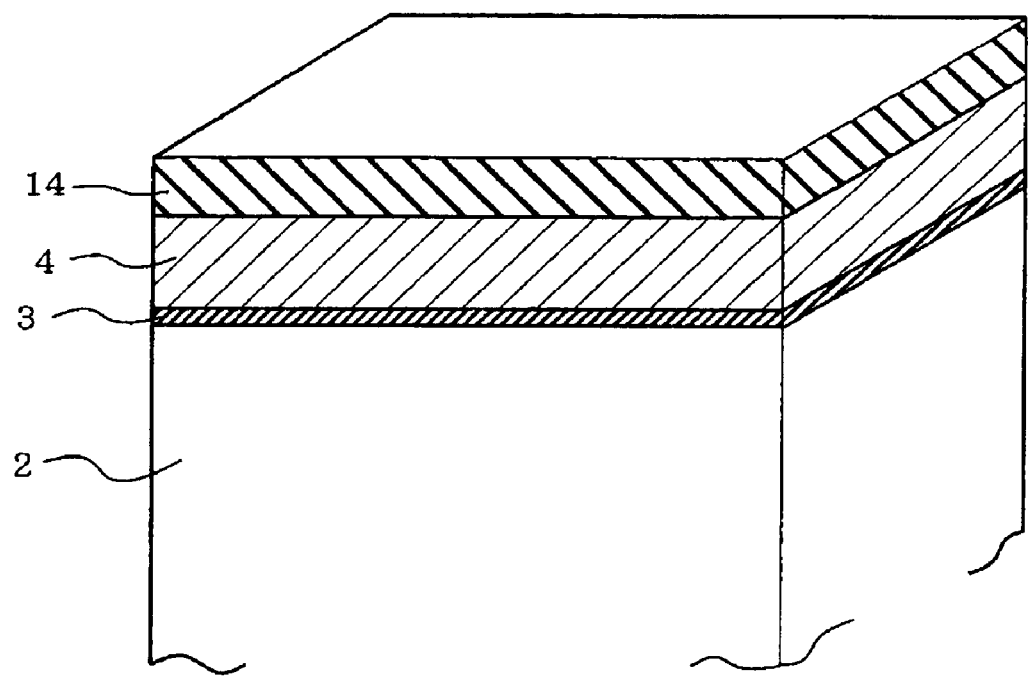
FIGS. 4 to 16 are typical longitudinally sectional views of the memory cell region in sequential steps of the fabricating process (Nos. 1 to 13).

As shown in FIG. 4, the silicon oxide film 3 serving as a gate insulating film is formed on the p-type silicon substrate 2 by a thermal oxidation method. The silicon oxide film 3 has a film thickness of about 10 nm, for example. Subsequently, the polycrystalline silicon layer 4 doped with impurities such as phosphorus is formed on the silicon oxide film 3 by the low pressure chemical vapor deposition (LPCVD) method. The polycrystalline silicon layer 4 has a film thickness of about 90 nm. The polycrystalline silicon layer 4 is finally configured into a floating gate electrode FG. Subsequently, the silicon nitride film 14 is formed on the polycrystalline silicon layer 4 by the LPCVD method.

Figure 5:
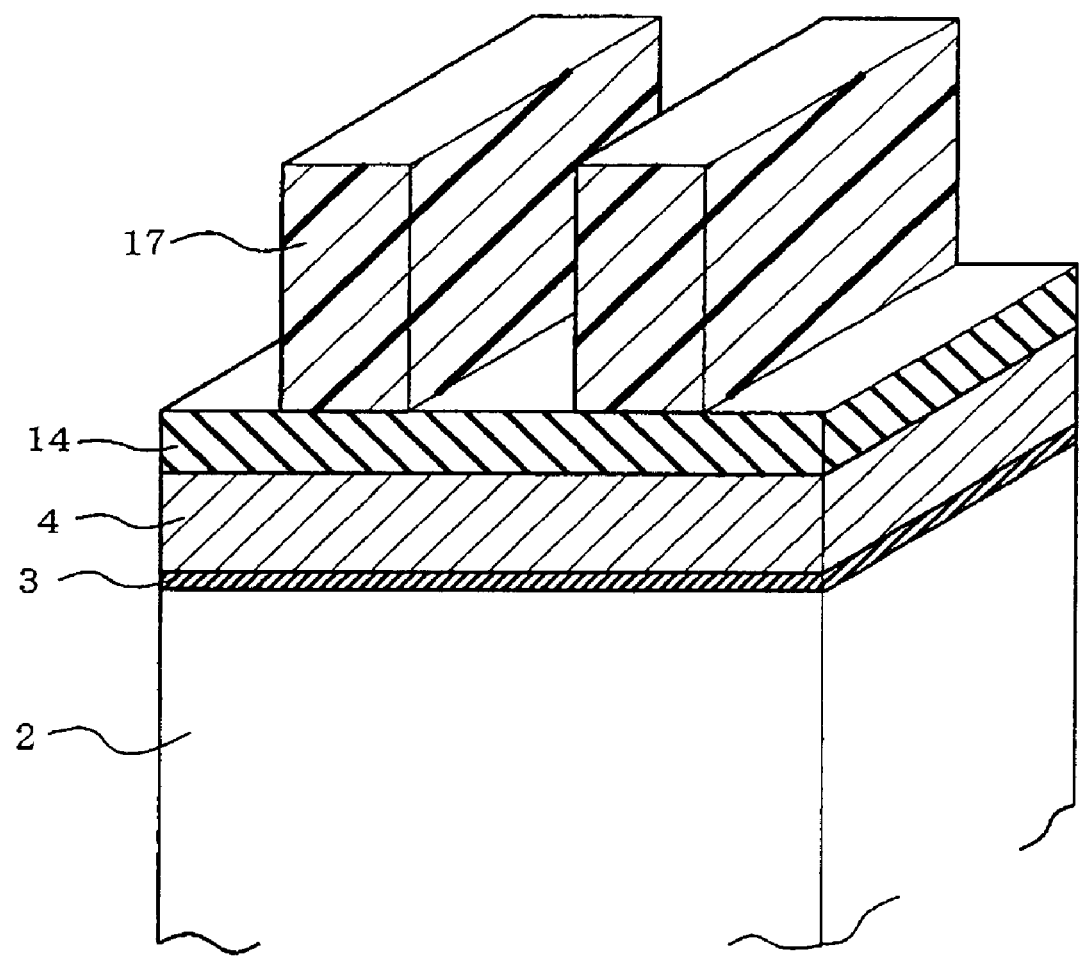
Figure 6:
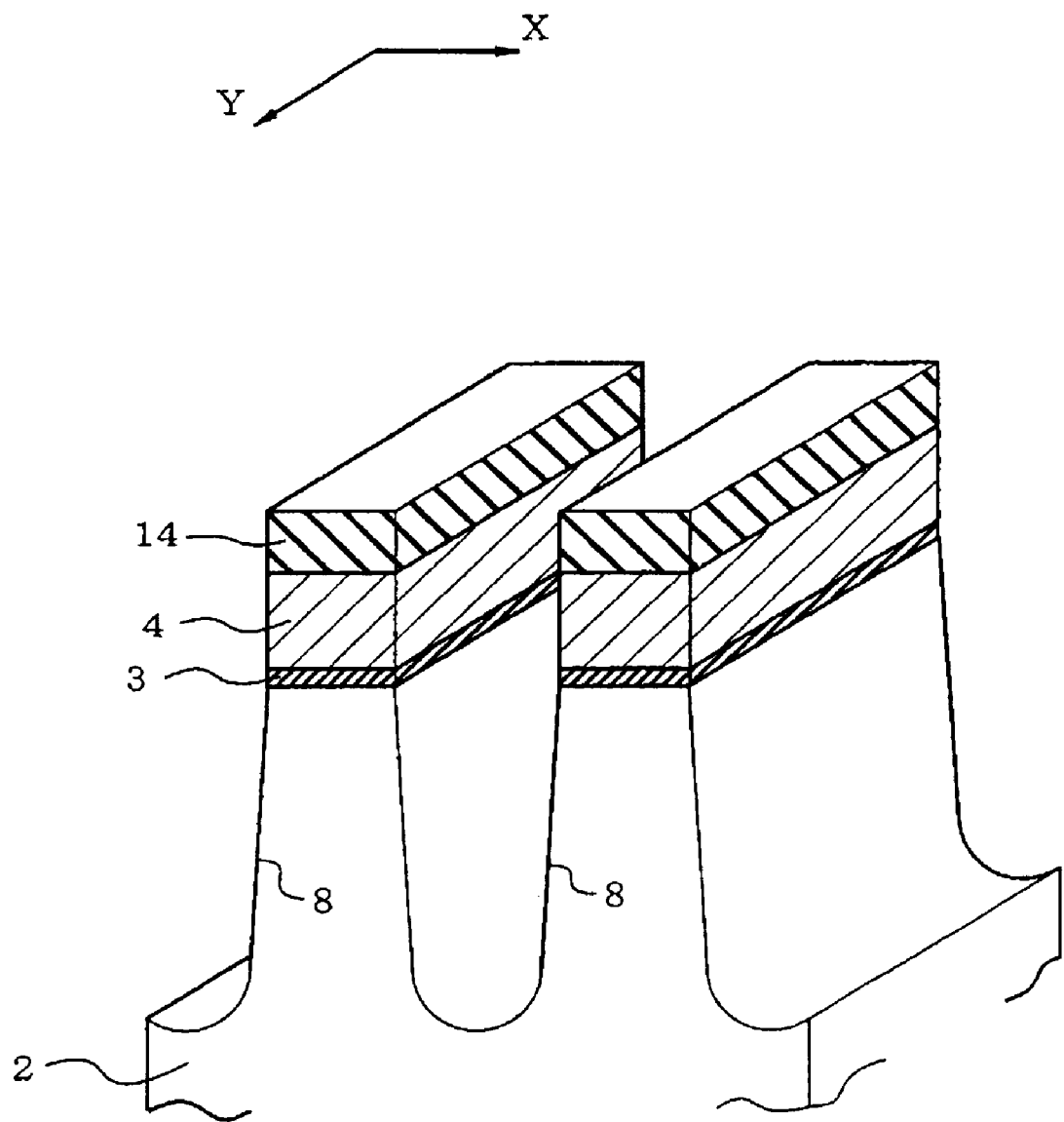

Subsequently, as shown in FIG. 5, the resist 17 is coated on the silicon nitride film 14 and patterned by the lithography technique. The patterning is carried out in order that the trench 8 may be formed to divide each of the polycrystalline silicon layer 4 and the silicon oxide film 3 in the X direction into a plurality of portions. Subsequently, as shown in FIG. 6, the silicon nitride film 14, the polycrystalline silicon layer 4, the silicon oxide film 3 and the upper side of the substrate 2 are etched by the reactive ion etching (RIE) process with the patterned resist serving as a mask. As a result, a plurality of trenches 8 are formed so as to extend in the predetermined direction and so as to be spaced away from each other in the X direction. Each of the polycrystalline silicon film 4 and the silicon oxide film 3 is divided by the trenches 8 into a plurality of portions. Thereafter, the resist 17 is removed by the ashing technique.

Figure 7:
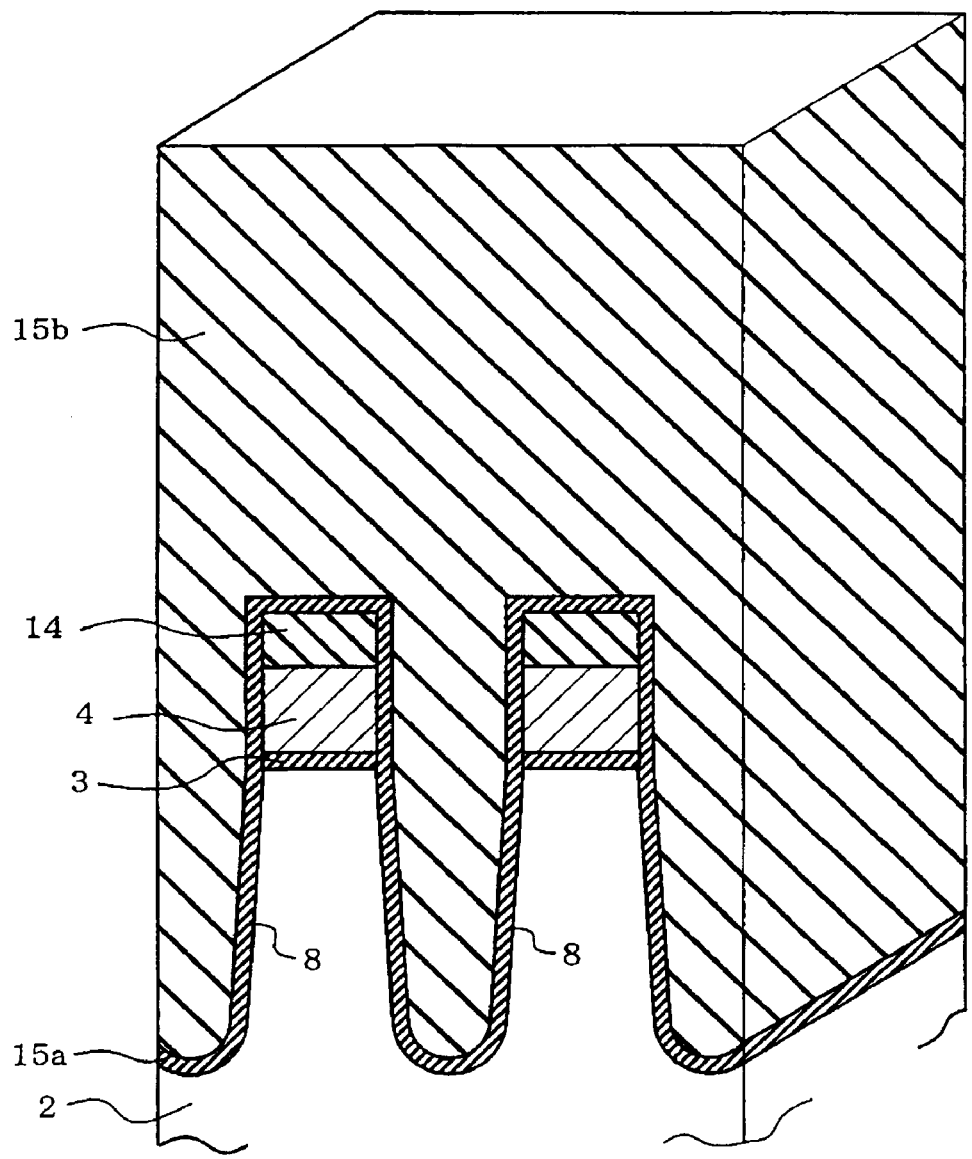

Subsequently, as shown in FIG. 7, a silicon oxide film 15a is formed by the LPCVD method so as to cover exposed surfaces (upper surface, sides and bottom) of the aforesaid processed elements including the silicon nitride film 14, the polycrystalline silicon layer 4, the silicon oxide film 3 and the upper portion of the substrate 2. The silicon oxide film 15a has a film thickness of about 15 nm. A polysilazane film 15b is coated on the silicon oxide film 15a so as to have a film thickness of about 600 nm and thermally treated in an oxidizing atmosphere so as to be converted to a silicon oxide film. The silicon oxide film 15a and the polysilazane film 15b are configured into the aforesaid element isolation insulating film 9.

Figure 8:
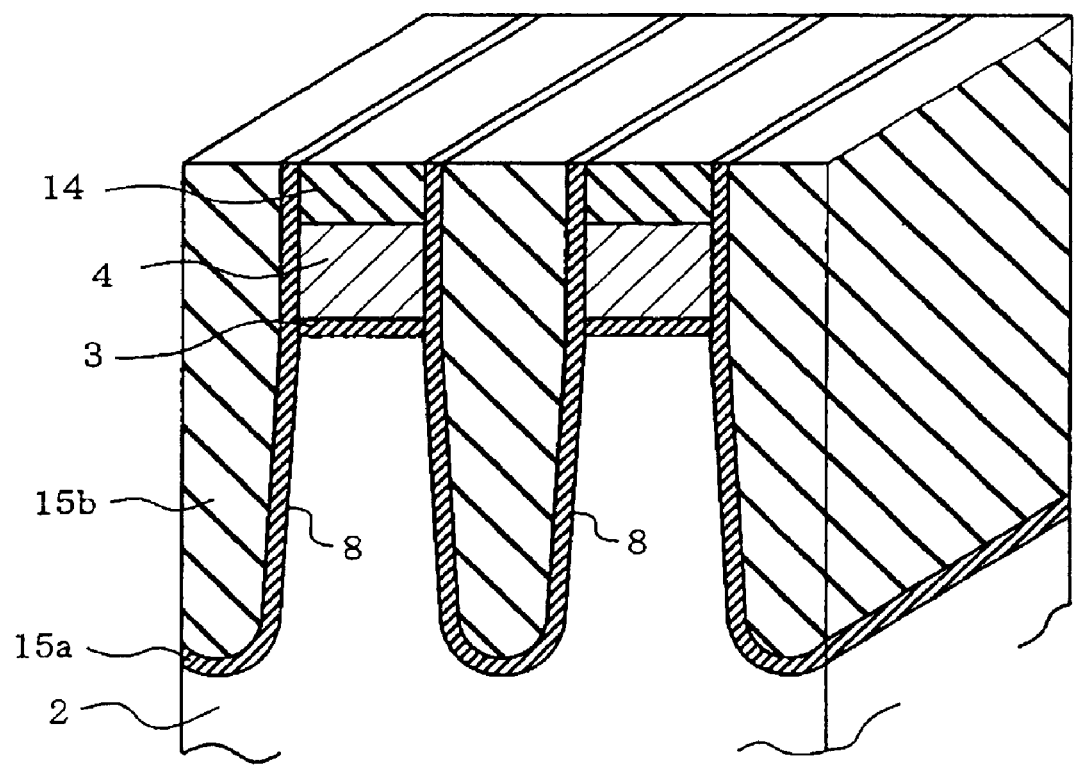
Figure 9:
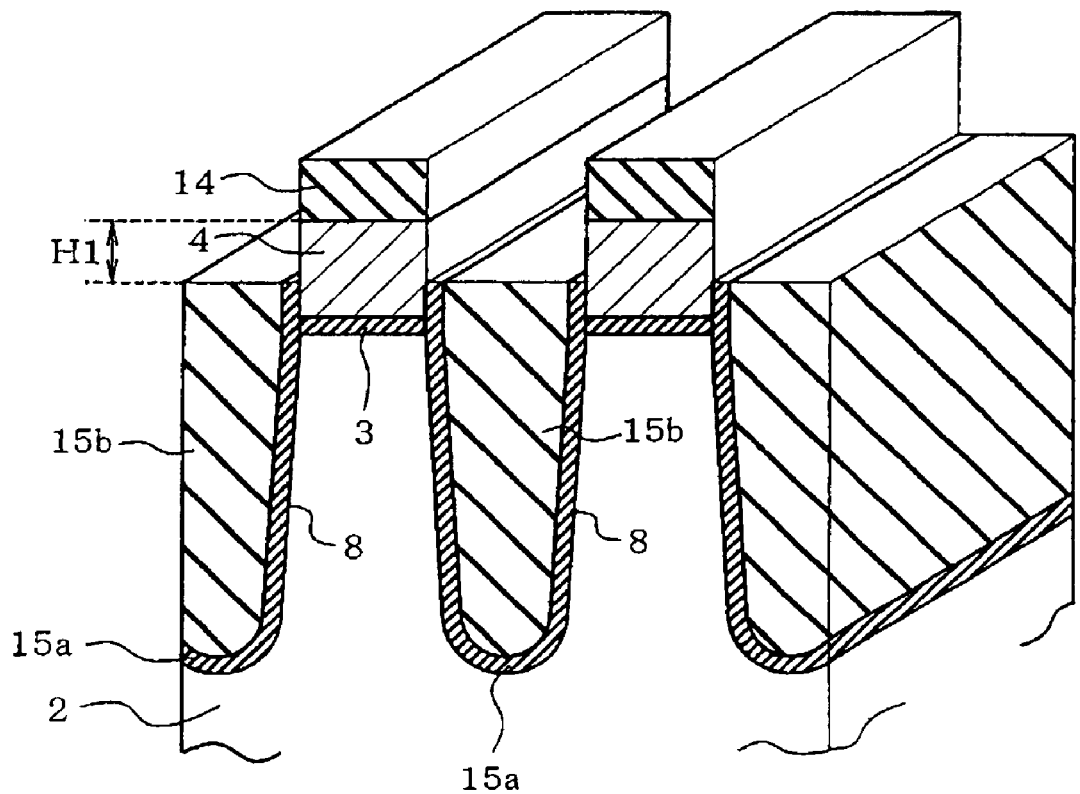

Subsequently, as shown in FIG. 8, the silicon oxide film 15a and the polysilazane film 15b are planarized by the chemical mechanical polishing (CMP) method so that the surface (upper surface) of the silicon nitride film 14 is exposed. Subsequently, as shown in FIG. 9, the surfaces of the silicon oxide film 15a and the polysilazane film 15b are etched back, so that a difference or step H1 is formed between the surfaces of the films 15a and 15b and the upper surface of the polycrystalline silicon layer 4. The step H1 is set to be not more than 70 nm. In this case, the silicon oxide film 15a and the polysilazane film 15b are etched under the condition that higher selectivity is given to the polycrystalline silicon. Thus, the step H1 is set to be not more than 70 nm in the embodiment although the step has conventionally been set to be not less than 100 nm. Consequently, the height of the silicon oxide film 15a and the polysilazane film 15b from the upper surface of the substrate 2 can be reduced as compared with the conventional height. Accordingly, the polycrystalline silicon layer 4 of the gate electrode isolation region GV can be removed more easily when to be removed.

Figure 10:
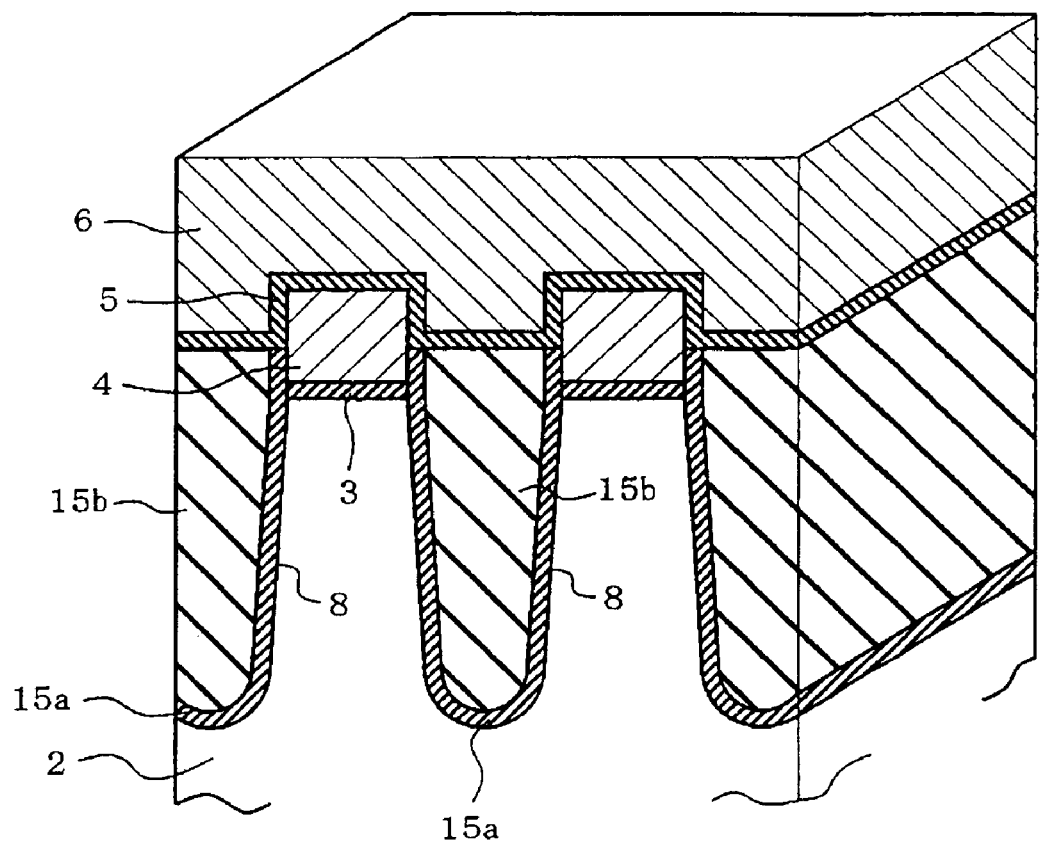
Figure 11:
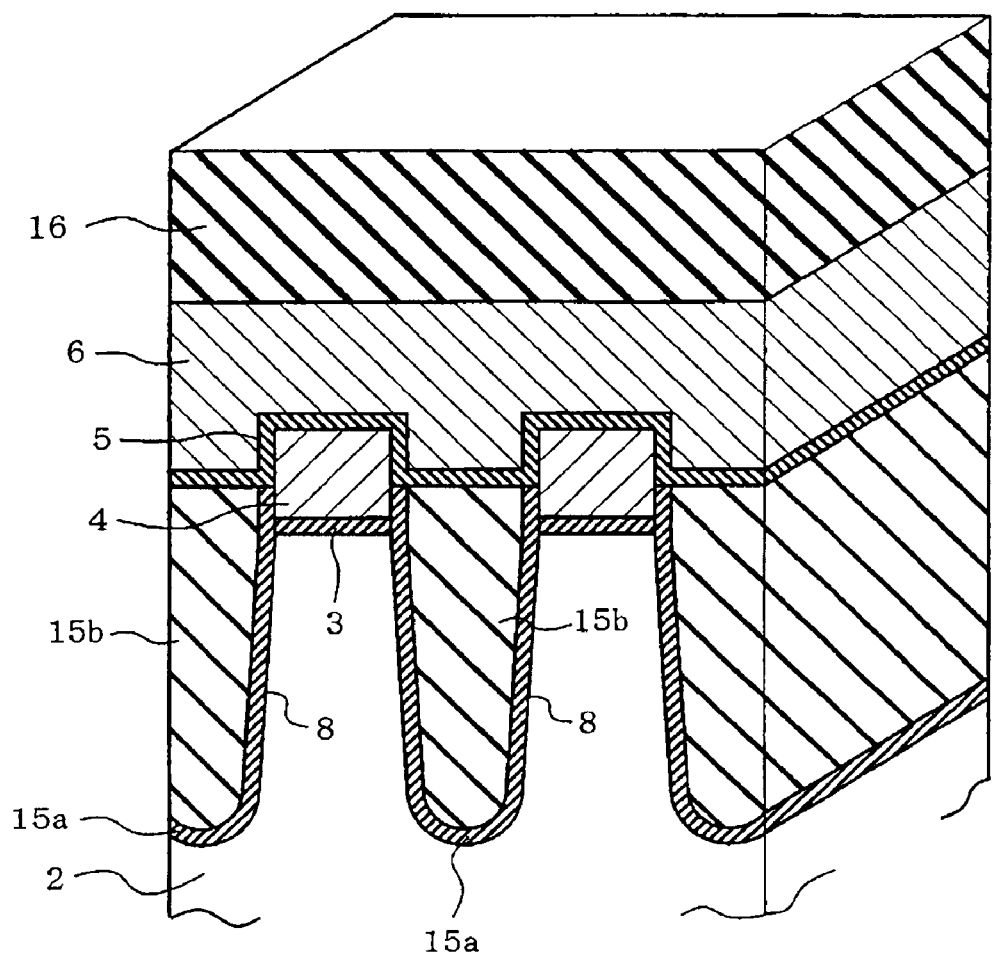
Figure 12:
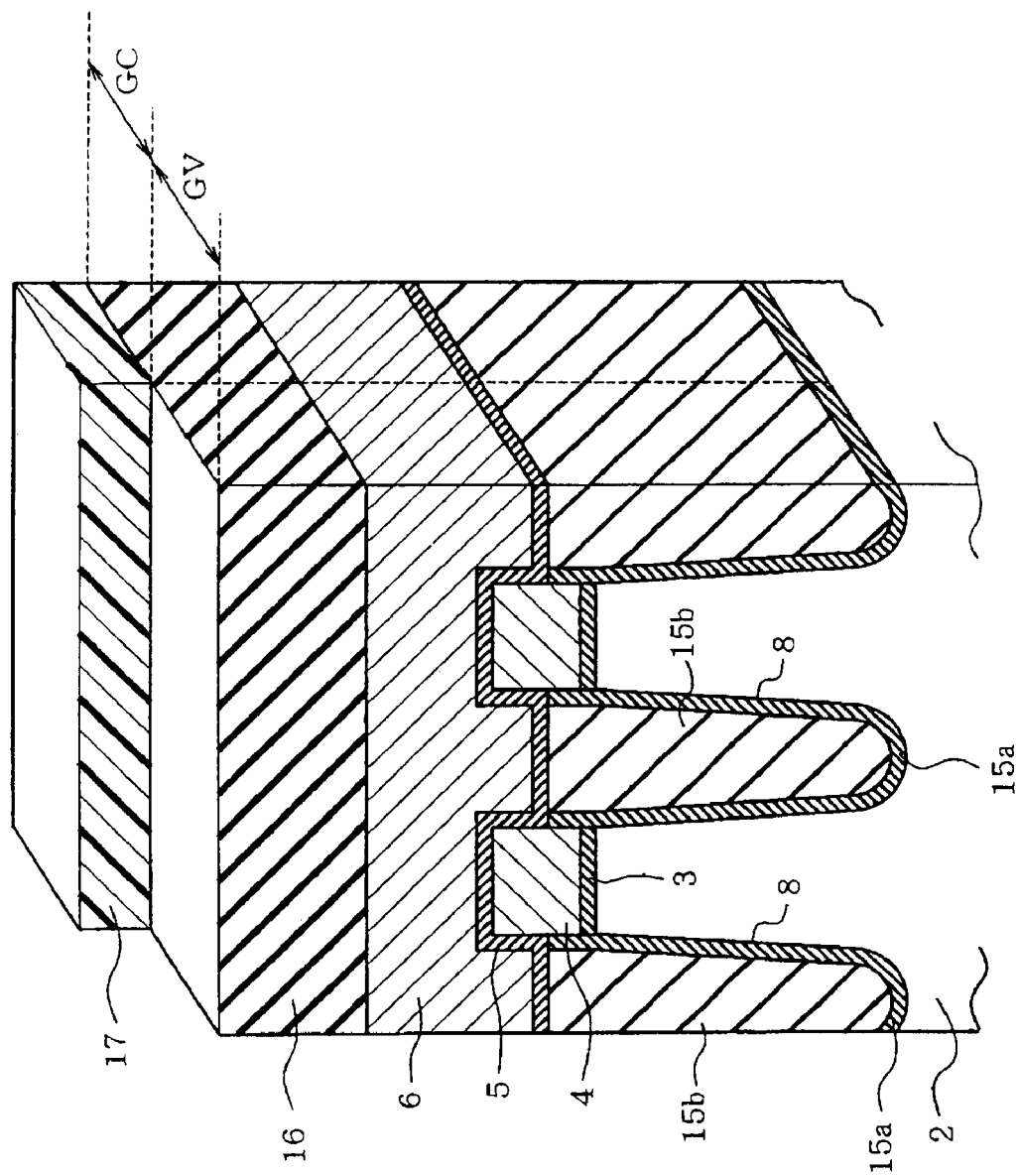

Subsequently, as shown in FIG. 10, the NONON film 5 as the intergate insulating film is formed by the LPCVD method so as to cover the polycrystalline silicon layer 4. The NONON film 5 has a film thickness ranging from 15 to 17 nm. Subsequently, a polycrystalline silicon layer 6 doped with impurities such as phosphorus by the LPCVD method. Subsequently, as shown in FIG. 11, the silicon nitride film 16 is formed on the polycrystalline silicon layer 6 by the LPCVD method. Subsequently, as shown in FIG. 12, the resist 17 is coated on the silicon nitride film 16 and then patterned. More specifically, the upper surface of the silicon nitride film 16 in the gate electrode isolation region GV is exposed. The resist 17 is patterned so as to mask the gate electrode forming region GC.

Figure 13:
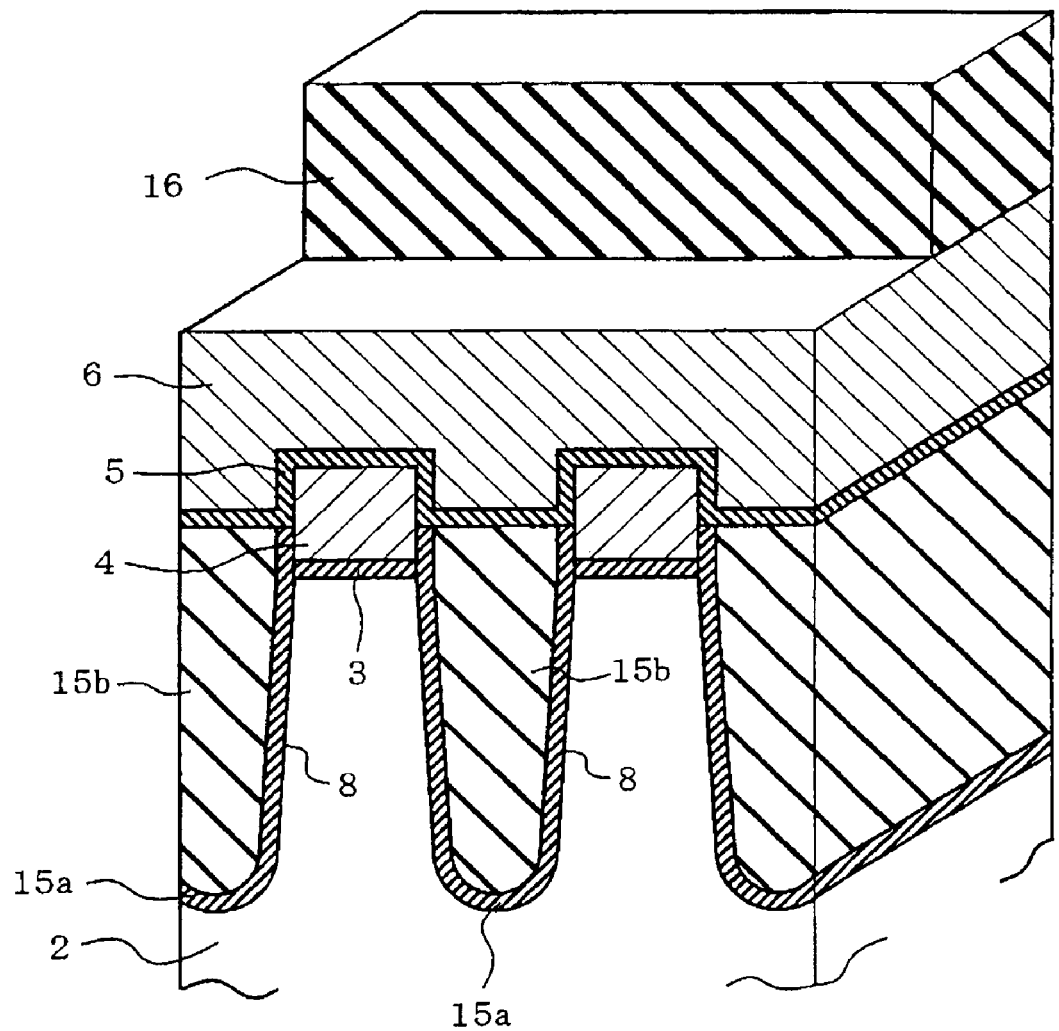
Figure 14:
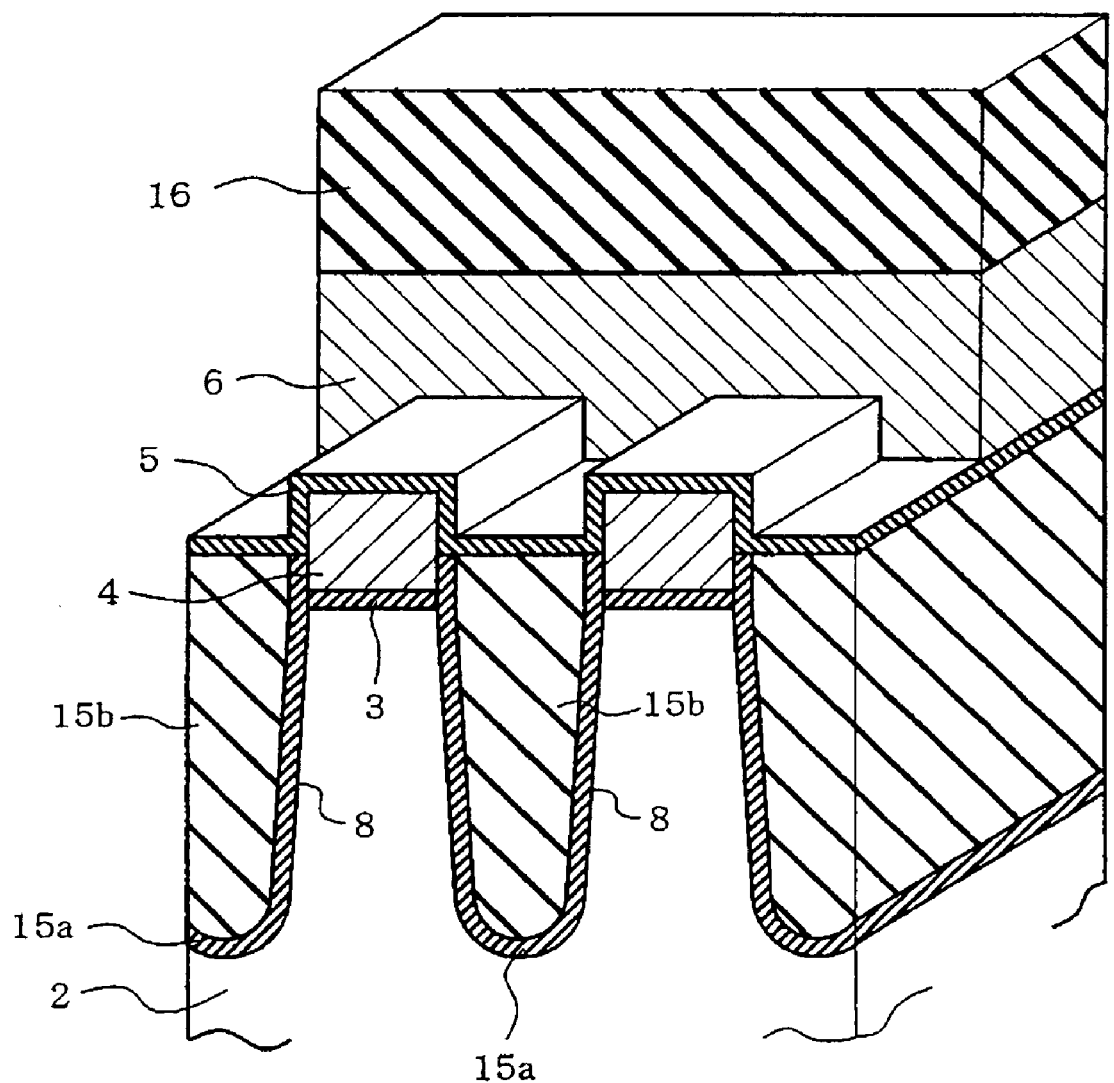
Figure 15:
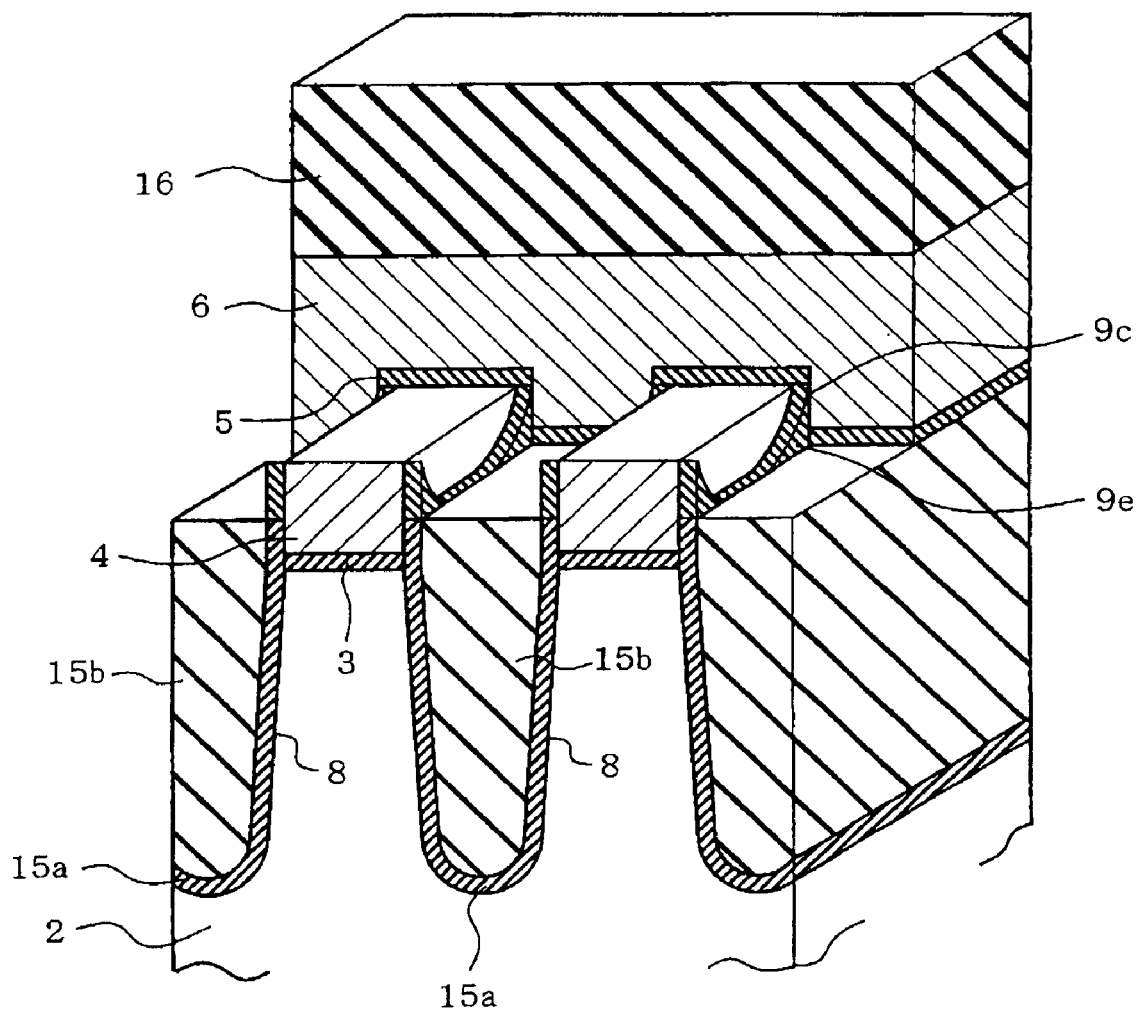
Figure 16:
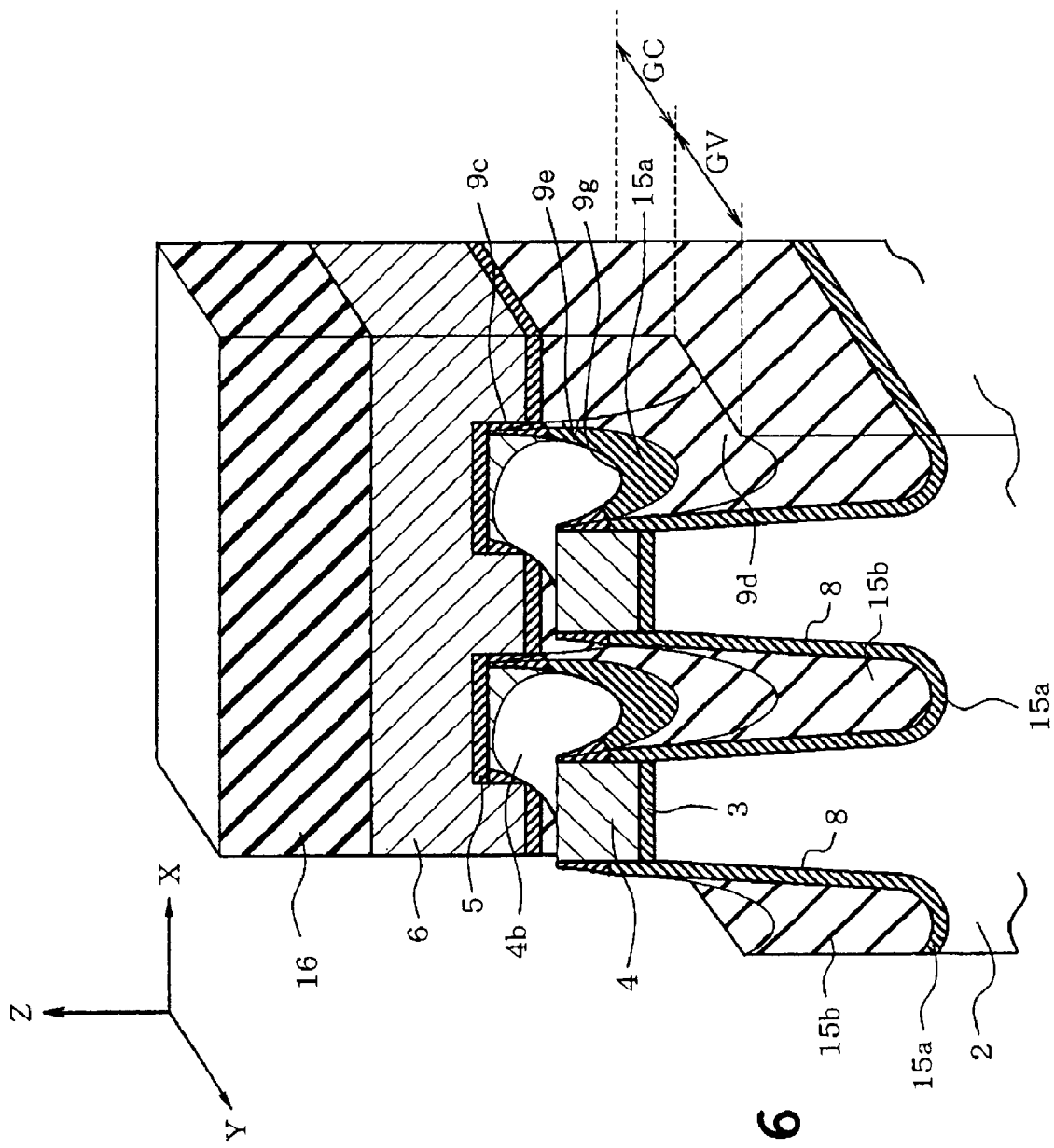

Subsequently, as shown in FIG. 13, the silicon nitride film 16 is etched by the RIE method with the patterned resist 17 serving as a mask, whereby the silicon nitride film 16 is divided. The resist 17 is then removed by the ashing technique. Subsequently, as shown in FIG. 14, the polycrystalline silicon layer 6 is etched by the RIE method under the condition that higher selectivity is given to the NONON film 5. Subsequently, as shown in FIGS. 15 and 16, the NONON film 5, the polysilazane film 15b and the silicon oxide film 15a are etched with the treating condition changed. In this case, the etching process is carried out using a CF gas under the condition that the selectivity between the layer 4 and the NONON film 5 ranges from 1:1.5 to 1:2. More specifically, the NONON film 5 formed on the polycrystalline silicon layer 4 is removed as shown in FIG. 5 and simultaneously, upper portions of the polysilazane film 15b and the silicon oxide film 15a in the gate electrode isolation region GV and the polycrystalline silicon layer 4 are etched to be removed as shown in FIG. 16. As the result of the aforesaid treatment, the upper surface of the polycrystalline silicon layer 4 is formed into a curved portion 4b which is upwardly convex in the X direction.

In FIGS. 15 and 16, the treatment is shown as having been stopped once before removing the upper portions of the polysilazane film 15b and the silicon oxide film 15a for the purpose of easy understanding of changes in the shape of the films 15a and 15b. Actually, however, these treatments are carried out in one and the same step.

As shown in FIG. 16, the etching process is carried out under the condition that the selectivity between the polycrystalline silicon layer 4 and the NONON film 5 is in a range of 1:1.5 to 1:2. As a result, in the gate electrode isolation region GV, the sidewall of the element isolation insulating film 9 located in the boundary between the element region Sa and the element isolation region Sb is formed so as to have such a U-shaped section that the central sidewall 9g is located lower than the sidewall edge 9c. In this case, the central sidewall 9g is configured so as to be located higher than the upper surface of the silicon oxide film 3. Furthermore, in the gate electrode isolation region GV, the element isolation insulating film 9 is configured by this treatment so as to have such a U-shaped section that the central portion 9d of the sidewall is located lower than the sidewall edge 9c in the X direction in FIG. 16. Further in the gate electrode isolation region GV, the upper surface of the polycrystalline silicon layer 4 is formed into the curved portion 4b which is upwardly convex in the X direction.

Subsequently, as shown in FIG. 3, the polycrystalline silicon layer 4 of the gate electrode isolation region GV is etched by the RIE method (anisotropic etching) under the condition that higher selectivity is given to the silicon oxide film. As a result, the remaining film 4a of the polycrystalline silicon layer 4 is prevented from remaining at both sides of the sidewall 9e although a slight amount of remaining film 4a with the film thickness of about 6 nm remains along the boundary between the gate electrode forming region GC and the gate electrode isolation region GV, as shown in FIGS. 2 and 3.

A thermal oxidation treatment is generally carried out after the above-described step. Even if the polycrystalline silicon layer 4 remains at the sides of the sidewall 9e, the remaining film can be oxidated by a high temperature thermal oxidation treatment. However, the thermal oxidation treatment is undesirable since the treatment results in bird beak in the silicon oxide film 3 and the polycrystalline silicon layer 4 is thermally shrunk. In the embodiment, the polycrystalline silicon layer 4 is formed so as to have a smaller thickness of 90 nm and accordingly a smaller height. Furthermore, the subsequent etch-back for the upper portion of the second element isolation insulating portion 9b is limited to the depth of no more than 70 nm from the upper surface thereof. Furthermore, the upper surface of the polycrystalline silicon layer 4, the NONON film 5, the silicon oxide film 15a and the polysilazane film 15b are etched under the condition that the selectivity between the polycrystalline silicon layer 4 and the NONON film 5 is in a range of 1:1.5 to 1:2, thereby being removed.

Consequently, the floating gate electrodes FG can be formed lower as compared with the conventional structure. Furthermore, since the second element isolation insulating portion 9b is formed lower so that the central sidewall 9g thereof is recessed, the remaining film 4a can be prevented at the whole sides of the sidewall 9e when the polycrystalline silicon layer 4 in the gate electrode isolation region GV is etched by the RIE method. Consequently, the electrical conduction can be prevented between the floating gate electrodes FG adjacent to each other in the Y direction.

Subsequently, ion implantation of impurities is carried out in order that the source/drain region 2a is formed in the surface layer of the silicon substrate 2. Next, an interlayer insulating film comprised of tetra-ethyl ortho-silicate (TEOS) is buried in the gate electrode isolation region GV. Furthermore, the silicon nitride film 16 is removed and the metal silicide layer 7, the interlayer insulating film and the barrier film extending over the metal silicide layer 7 and other wiring layer (not shown) are formed. Still furthermore, the NAND flash memory 1 is fabricated through the other film treatments and the post-process although these treatments and post-process will not be described in detail.

The invention should not be limited by the foregoing embodiment. The embodiment may be modified or expanded as follows. Although the silicon substrate 2 is used as the semiconductor substrate in the embodiment, the semiconductor substrate may be made from another material. Furthermore, another gate insulating film material may be used, instead of the silicon oxide film 3. Another electrically conductive material (floating gate electrode material: silicon nitride film or the like) may be used, instead of the polycrystalline silicon layers 4 and 6.

Although the NONON film 5 is employed as the intergate insulating film in the foregoing embodiment, a stacked structure of an oxide film layer such as an ONO film and a nitride film layer may be used or another structure including a high dielectric material film may be used. The invention may be applied to any semiconductor device when the semiconductor device has a memory cell structure that the floating gate electrodes FG are lined up or arranged in the Y direction (the predetermined direction) and the X direction (intersecting direction).

The upper surface of the element isolation insulating film 9 may be caused to correspond with the upper surface of the polycrystalline silicon layer 4 when the element isolation insulating film 9 is formed in the trench 8. The NONON film 5 may be formed into a flat shape so as to extend over the upper surfaces of the polycrystalline silicon layer 4 and the element isolation insulating film 9. The same effect can be achieved from this configuration as from the above-described structure.

It is desirable that the height of the upper end of the element isolation insulating film 9 is no more than 35 nm from the surface of the silicon substrate. In this case, the etching process for the polycrystalline silicon layer 4 in the gate electrode isolation region GV can easily be carried out.

Although applied to the NAND flash memory in the foregoing embodiment, the invention may be applied to EEPROMs, EPROMs or NOR flash memories. The invention may further be applied to other non-volatile semiconductor devices, semiconductor storage devices and semiconductor devices.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A method of fabricating a semiconductor device, comprising:
    forming a gate insulating film on a first upper surface of a semiconductor substrate, the gate insulating film having a second upper surface;
    forming a floating gate electrode layer on the gate insulating film, the floating gate electrode layer having a third upper surface;
    forming a trench in the floating gate electrode layer, the gate insulating film and the substrate in a predetermined direction, thereby dividing each of the floating gate electrode layer and the gate insulating film into a plurality of first divided regions;
    forming an element isolation insulating film in the first divided regions so that the element isolation insulating film including a silicon oxide film has a fourth upper surface located lower than the third upper surface of the floating gate electrode layer and higher than the second upper surface of the gate insulating film;
    forming an intergate insulating film so that the floating gate electrode layer and the element isolation insulating film are covered with the intergate insulating film, the intergate insulating film having a silicon oxide film layer;
    forming a control gate electrode layer on the intergate insulating film;
    removing the control gate electrode layer in an intersecting direction intersecting the predetermined direction, thereby dividing the control gate electrode layer into a plurality of second divided regions;
    etching the intergate insulating film and the element isolation insulating film in the second divided regions when a selectivity between the floating gate electrode layer and the intergate insulating film is in a range of 1:1.5 to 1:2; and
    removing the floating gate electrode layer located in the second divided regions.

2. The method according to claim 1, wherein the etching step etches the element isolation insulating film so that a center of a sidewall of the element isolation insulating film in the predetermined direction is located lower than an end of the sidewall of the element isolation insulating film.

3. A method of fabricating a semiconductor device, comprising:
    forming a gate insulating film on a first upper surface of a semiconductor substrate, the gate insulating film having a second upper surface;
    forming a floating gate electrode layer having a film thickness of about 90 nm on the second upper surface of the gate insulating film and a third upper surface;
    forming a trench in the floating gate electrode layer, the gate insulating film and the semiconductor substrate in a predetermined first direction, thereby dividing each of the floating gate electrode layer and the gate insulating film into a plurality of first regions;
    forming an element isolation insulating film in the trench so that the element isolation insulating film has a fourth upper surface located lower than the third upper surface of the floating gate electrode layer with a step of not more than 70 nm with respect to the third upper surface of the floating gate electrode layer and further located higher than the second upper surface of gate insulating film, the element isolation insulating film having a sidewall;
    forming an intergate insulating film so that the floating gate electrode layer and the element isolation insulating film are covered with the intergate insulating film;
    forming a control gate electrode layer on the intergate insulating film;
    removing the control gate electrode layer in a second direction intersecting the first direction, thereby dividing the control gate electrode layer into a plurality of divided regions;
    removing the intergate insulating film and the element isolation insulating film in the divided regions of the control gate electrode layer, thereby removing the element isolation insulating film so that a center of the sidewall of the element isolation insulating film in the predetermined direction is located lower than an end of the sidewall of the element isolation insulating film; and
    removing the floating gate electrode layer located in the divided regions of the control gate electrode layer and the intergate insulating film.

4. The method according to claim 3, wherein the element isolation insulating film has an upper end, and in the element isolation insulating film forming step, the element isolation insulating film is formed in the trench so that the upper end of the element isolation insulating film is about 35 nm high with respect to the upper surface of the semiconductor substrate.

* * * * *